(12) United States Patent
Dietrich et al.

(10) Patent No.: US 11,047,817 B2
(45) Date of Patent: Jun. 29, 2021

(54) PHYSICAL PROPERTIES MEASUREMENT SYSTEM

(71) Applicants: Kurt Edward Dietrich, Ellicott City, MD (US); Thomas F. Ambrose, Crownsville, MD (US); Eric C. Gingrich, Elkridge, MD (US); Timothy Richard Barbour, Halethorpe, MD (US)

(72) Inventors: Kurt Edward Dietrich, Ellicott City, MD (US); Thomas F. Ambrose, Crownsville, MD (US); Eric C. Gingrich, Elkridge, MD (US); Timothy Richard Barbour, Halethorpe, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 231 days.

(21) Appl. No.: 16/387,340

(22) Filed: Apr. 17, 2019

(65) Prior Publication Data

US 2020/0332958 A1 Oct. 22, 2020

(51) Int. Cl.
*G01N 25/18* (2006.01)
*F25D 3/10* (2006.01)
(Continued)

(52) U.S. Cl.
CPC .............. *G01N 25/18* (2013.01); *F25D 3/10* (2013.01); *H01L 23/445* (2013.01); *F17C 1/005* (2013.01)

(58) Field of Classification Search
None
See application file for complete search history.

(56) References Cited

U.S. PATENT DOCUMENTS 4,751,828 A * 6/1988 Coulter .................... G01N 1/42
                                                            62/51.1
5,038,571 A * 8/1991 Yokouchi ............... C09K 5/045
                                                            62/46.1
(Continued)

FOREIGN PATENT DOCUMENTS

WO         0196020 A1    12/2001

OTHER PUBLICATIONS

International Search Report for International Application No. PCT/US2020/021807 dated Jun. 16, 2020.

*Primary Examiner* — Douglas X Rodriguez
(74) *Attorney, Agent, or Firm* — Tarolli, Sundheim, Covell & Tummino LLP (57) ABSTRACT

A sealed container having gloves attached thereto is provided as part of a physical properties measuring system (PPMS). The PPMS includes a sealed pressurized portion that is pressurized with a gas to purge out air from inside the sealed pressurized portion to reduce water vapor inside the sealed pressurized portion below a water vapor threshold. The system further includes a cryogenic tank having a cryostat disposed therein. The cryogenic tank contains a cryogenic liquid cooled to a cryogenic temperature. Test samples are placed inside the sealed pressurized portion in preparation of measuring physical properties of the test samples. One of the test samples is immersed in the cryogenic liquid to measure the physical properties. The test sample is removed from the cryogenic liquid and is exchanged for another test sample inside the sealed pressurized portion to prevent ice formation inside the cryostat.

12 Claims, 9 Drawing Sheets

(51) Int. Cl.
    *H01L 23/44*    (2006.01)
    *F17C 1/00*    (2006.01)

(56) References Cited

U.S. PATENT DOCUMENTS

| | | | |
|---|---|---|---|
| 5,606,860 A * | 3/1997 | Popp | B08B 9/08 |
| | | | 62/63 |
| 7,268,563 B2 | 9/2007 | Hariharan et al. | |
| 2020/0124336 A1 * | 4/2020 | Moon | F25D 3/105 |

* cited by examiner

PHYSICAL PROPERTIES MEASUREMENT SYSTEM

TECHNICAL FIELD

This disclosure relates generally to a Physical Properties Measurement System, and more specifically to a closed pressurized Physical Properties Measurement System.

BACKGROUND

Physical Properties Measurement Systems (PPMS) measure(s) physical properties (e.g., magnetic and electrical transport properties including superconductivity) of material samples (e.g., Nickel-Iron alloys and Niobium) over a broad temperature range including low temperatures (e.g., liquid helium or 4.2 K). Currently, in order to measure the physical properties of a test sample at low temperature, a cryostat is used. A cryostat is an instrument that allows for a well-controlled temperature variation of a test sample either above or below room temperature. Typically, the cryostat sits in a cryogenic liquid (e.g., helium, nitrogen) and controls the sample temperature by heating and changing the flow of liquid through the sample chamber. Installing and removing test samples from the cryostat requires the cryostat to be at room temperature to reduce water vapor and icing effects. Once the test sample is secured in the cryostat, it can be cooled to a low temperature. After the measurements are performed on the test sample, the cryostat system must then be warmed to room temperature before removing the test sample. The test sample is then removed from the cryostat and the process is repeated with a new test sample. For measurements that are performed at low temperature, a cycle time (warm to room temperature, change sample and re-cool to low temperature) is on the order of hours depending upon the system warming and cooling rates. Thus, a more efficient process to change test samples in a timely manner is needed.

SUMMARY

The following presents a simplified summary in order to provide a basic understanding of the subject disclosure. This summary is not an extensive overview of the subject disclosure. It is not intended to identify key/critical elements or to delineate the scope of the subject disclosure. Its sole purpose is to present some concepts of the subject disclosure in a simplified form as a prelude to the more detailed description that is presented later.

One example of the subject disclosure includes a method of measuring physical properties of a superconducting element. The method includes providing a closed physical properties measurement system including a cryostat having a sample test chamber cooled to a cryogenic temperature in a cryogenic tank and a sealed container attached to the cryogenic tank and placing a plurality of test samples attached to a respective plurality of test sample rods into the sealed container. The method further includes reducing water vapor and ice formed inside the sample test chamber, inserting one of the plurality of test samples into the cryogenic tank, and measuring physical properties of one of the plurality of test samples at the cryogenic temperature. One of the plurality of test samples is switched with another one of the plurality of test samples inside the sealed container to prevent ice formation inside the cryostat. Another one of the plurality of test samples is inserted in the cryogenic tank and the physical properties of another one of the plurality of test samples is measured at the cryogenic temperature.

Another example of the subject disclosure includes a physical properties measuring system that includes a cryogenic tank that contains a cryogenic liquid cooled to a cryogenic temperature. The cryogenic tank includes a cryostat disposed therein and has an opening defined in a top surface. A sealed container is attached to the cryogenic tank. The sealed container includes a mounting opening defined in a bottom surface that aligns with the opening in the top surface of the cryogenic tank. A fastening device attaches the sealed container to the cryogenic tank such that an air tight seal is formed between the sealed container and the cryogenic tank. A test rod retraction tube is attached to a top surface of the sealed container. The test rod retraction tube has a seal flange that seals an opening defined in the top surface of the sealed container such that an air tight seal is formed between the sealed container and the test rod extraction tube. A door is attached to a door side wall of the sealed container. The door includes a seal that forms an air tight seal between the door and the door side wall when the door is in a closed position. The system further includes gloves that allow access the interior of the sealed container via glove openings defined in opposite side walls of the sealed container and seal ring assemblies that seal the gloves to the side walls of the sealed container such that an air tight seal is formed between the sealed container and the gloves.

BRIEF DESCRIPTION OF THE DRAWINGS

The accompanying drawings, which are incorporated in and constitute a part of the specification, illustrate various systems, methods, and other examples of the disclosure. Illustrated element boundaries (e.g., boxes, groups of boxes, or other shapes) in the figures represent one example of the boundaries. In some examples, one element may be designed as multiple elements or multiple elements may be designed as one element. In some examples, an element shown as an internal component of another element may be implemented as an external component and vice versa.

DETAILED DESCRIPTION

The disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure can be practiced without these specific details. In other instances, well-known structures and devices are shown in block diagram form in order to facilitate describing the subject disclosure.

While specific characteristics are described herein (e.g., thickness, orientation, configuration, etc.), it is to be understood that the features, functions and benefits of the subject disclosure can employ characteristics that vary from those described herein. These alternatives are to be included within the scope of the disclosure and claims appended hereto.

Figure 1A:
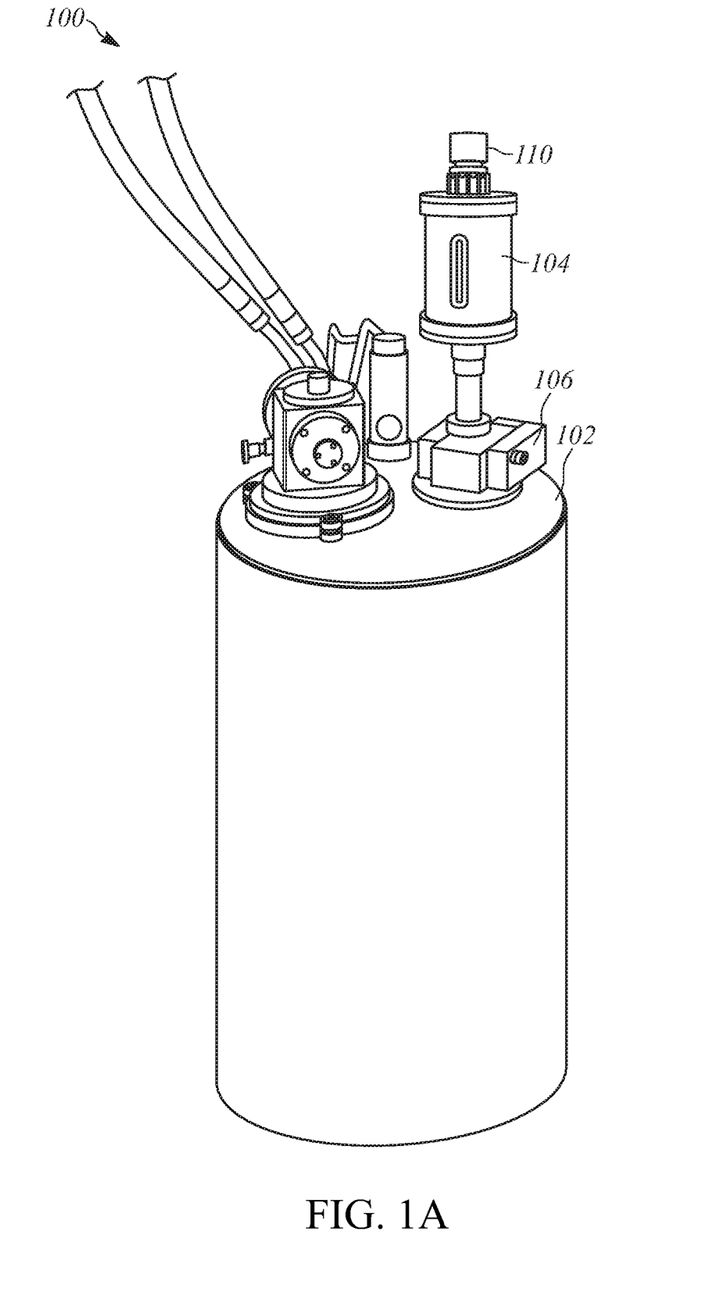
FIGS. 1A and 1B illustrate a conventional physical properties measurement system.
Figure 1B:
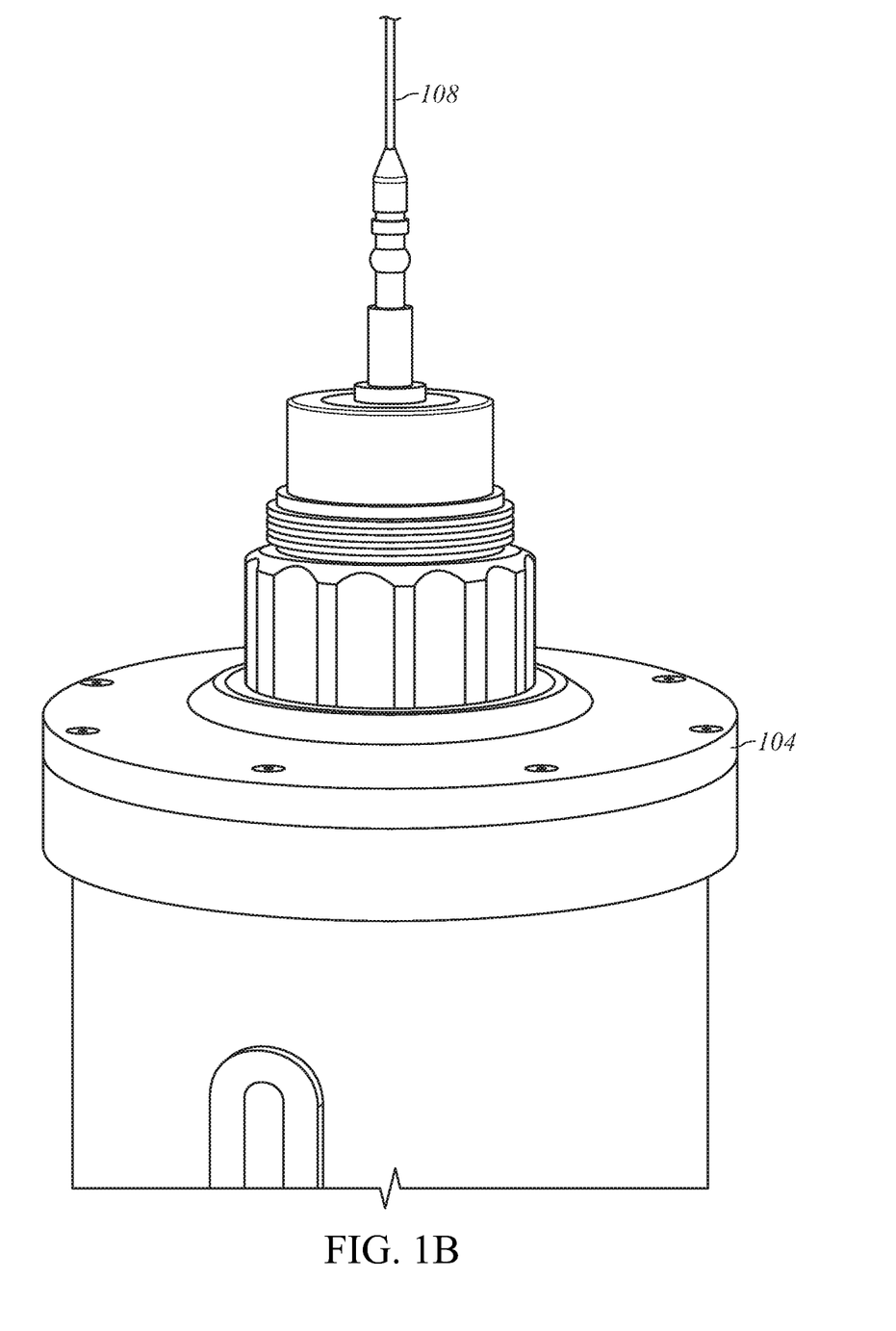

In a conventional physical properties measurement system (PPMS) 100 illustrated in FIGS. 1A and 1B, a cryogenic tank (e.g., a Dewar) 102 which contains a cryostat is provided and filled with a cryogenic liquid. Inside the cryostat a test sample resides where the temperature can be carefully controlled. An optional vibrating mechanism (e.g., vibrating sample magnetometer) 104 can be attached to an opening in the top of the cryogenic tank 102 via a coupler 106. A test sample (e.g., silicon wafer) is attached to an end of a test rod 108 approximately 3-4 feet in length. The test rod 108 is inserted down into the vibrating mechanism 104 (see FIG. 1B) such that the test sample is inserted approximately 30-50% into the cryogenic tank 102. A top end of the test rod is then clamped inside the vibrating mechanism 104 and a cap 110 is placed on top of the vibrating mechanism. The test sample is then cooled to the cryogenic temperature and the appropriate tests are performed on the test sample. Once the measurements are completed, the cryostat sample chamber is then warmed to room temperature before the test sample is removed from the cryostat. The warming of the cryostat sample chamber from low temperature to room temperature prevents ice crystals from forming on the test sample when the test sample is removed from the cryostat. The formation of ice may damage the cryostat and thus, a disadvantage of the conventional system is the time cycle required to warm the cryogenic liquid to room temperature to switch out the test samples and then cool the cryogenic liquid to the cryogenic temperature to perform the measurements. The formation of ice inside the cryostat will prevent vibration of the sample, i.e. the sample will get stuck thus, precluding any measurements.

Disclosed herein is an example system and method to perform physical properties measurements (e.g., magnetic measurements, electrical measurements, superconductivity measurements) on test samples (e.g., silicon wafers) that eliminates the warming/cooling time cycle required in conventional systems, thus overcoming the aforementioned disadvantage. The example system provides a closed measurement environment that is pressurized with a gas (e.g., helium) to allow the measuring of multiple test samples at cryogenic temperatures without the risk of damaging the cryostat.

Figure 2:
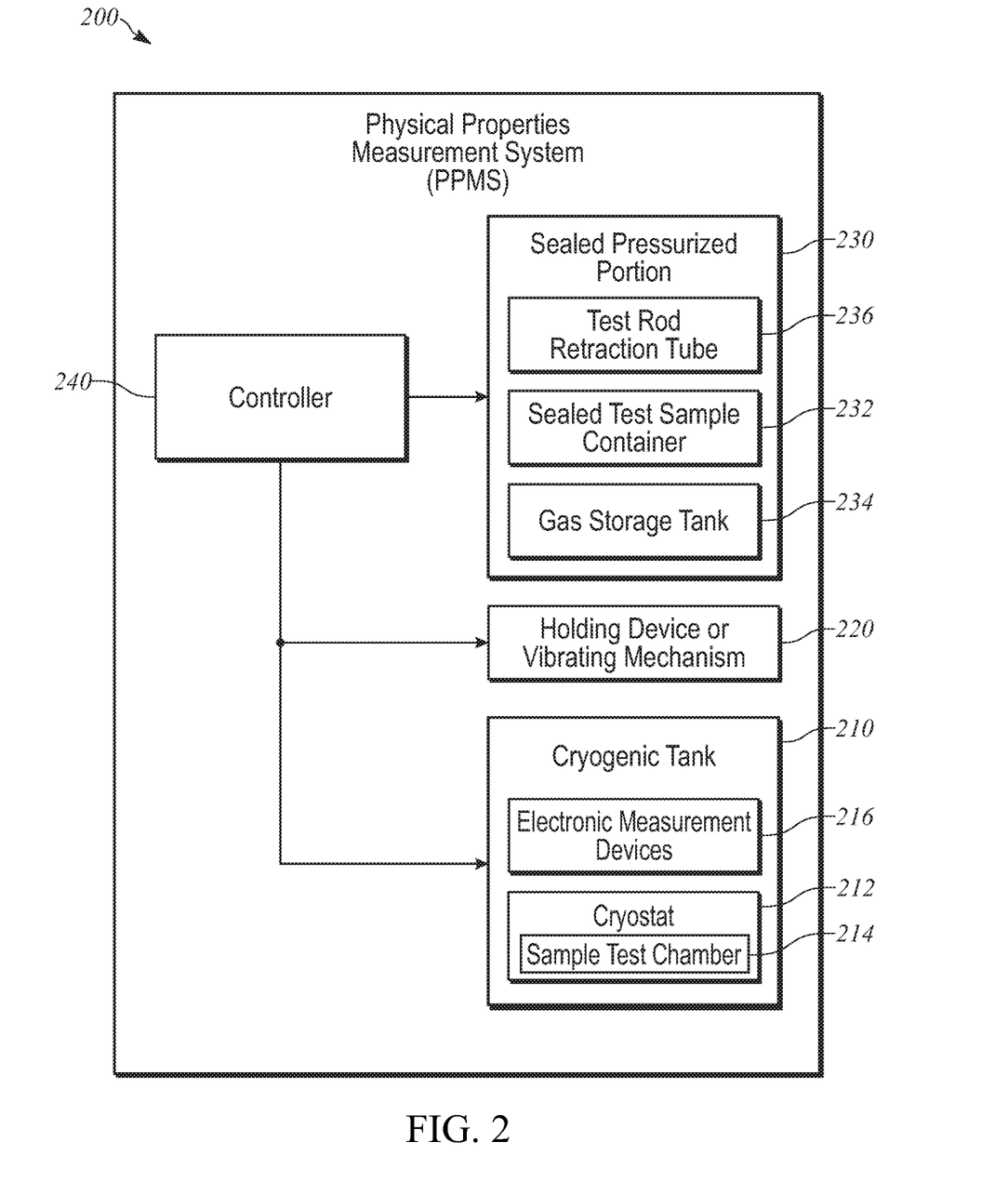
FIG. 2 is an example block diagram illustration of a closed or pressurized physical properties measurement system (PPMS).

FIG. 2 is a block diagram illustration of a closed or pressurized physical properties measurement system (PPMS) 200. The PPMS 200 is configured to measure superconductive physical properties of a test sample (e.g., silicon wafer) illustrated in FIG. 8. The PPMS 200 includes a cryogenic tank (e.g., Dewar) 210, a test rod holding device or a vibrating mechanism (e.g., vibrating sample magnetometer) 220, a sealed pressurized portion 230, and a controller 240. As in the conventional system, the test sample is attached to an end of a test sample rod, which is connected to a test rod, see FIG. 7, which in total is approximately 3-4 feet in length. The test rod is inserted down into the vibrating mechanism 220 such that the test sample is inserted approximately 30-50% into the cryogenic tank 210. A top end of the test rod is then clamped inside the vibrating mechanism 220 and a cap is placed on top of the vibrating mechanism 220. In the PPMS 200, however, the test samples and the test rod remain inside the sealed pressurized portion 230 during the measurement procedure. Thus, the test samples are not exposed to water vapor in the outside air thereby preventing water vapor deposition on the test samples.

The cryogenic tank 210 stores a cryogenic liquid (e.g., liquid helium) at extremely low temperatures (e.g., cryogenic temperature of approximately 4 K). The cryogenic tank 210 includes a cryostat 212 disposed therein. The cryostat 212 includes a sealed test chamber 214 for insertion of the test sample as mentioned above. The cryogenic tank 210 further includes electronic measurement devices 216 to measure properties of the test sample, such as magnetization, superconductivity, etc.

The holding device or vibrating mechanism 220 is an optional device that is connected to a top of the cryogenic tank 210. Both the holding device or the vibrating mechanism 220, when connected to the cryogenic tank 210 form a path that allows the insertion of the test sample through the holding device or the vibrating mechanism 220 and into the cryogenic tank 210. The holding device clamps and holds a test rod (see FIG. 7) in place while measurements are being performed on the test sample. The vibrating mechanism 220 serves two functions. First, the vibrating mechanism 220 clamps and holds the test rod in place while measurements are being performed on the test sample. Second, during certain measurements, the vibrating mechanism 220 vibrates the test rod, which in turn vibrates the test sample while measurements are being performed on the test sample. In other examples, the vibrating mechanism can be omitted and replaced by a holding device, a rotation device, etc.

The sealed pressurized portion 230 includes a sealed test sample container (hereinafter "sealed container") 232, a gas storage tank 234, and a test rod retraction tube 236. The gas storage tank 234 is connected and sealed to a port in the sealed container 232 via a gas transfer hose. Prior to performing the measurements, test samples are placed inside the sealed container 232 via an opening and the opening is then sealed with a hinged or removable door. The sealed container 232 is then pressurized with a gas (e.g., helium) from the gas storage tank 234 to purge out the air, which in turn reduces the amount of water vapor inside the sealed container 232. The sealed container 232 may include a one-way purge valve to allow the air inside the sealed container 232 to escape during the purging process. Once the humidity (i.e., the amount of water vapor in the air inside the sealed container 232) is below a threshold, the measurement procedure commences, as will be explained further below. The purged sealed container 232 facilitates the switching of test samples without the need to warm and cool the cryogenic liquid between room temperature and the cryogenic temperature respectively. This in turn saves hours of time, which increases efficiency and reduces labor and measurement costs.

The sealed pressurized portion 230 further includes a test rod retraction tube 236 that attaches to the sealed container 232. When the test rod is extracted from the cryogenic tank 210, the test rod extends into the test rod retraction tube 236 until the test sample is inside the sealed container 232. The test sample is then removed from the test rod and another test sample is attached to the end of the test rod. The test rod is then extracted from the test rod retraction tube 236 and inserted into the holding device or vibrating mechanism 220 and into the cryogenic tank 210 such that the test sample is inserted approximately 30-50% into the cryogenic tank 210. Thus, the test rod retraction tube 236 facilitates the extraction of the test rod and subsequently the extraction and changing of the test sample without water vapor deposition forming on the test samples.

The controller 240 provides control to the cryogenic tank 210, the vibrating mechanism 220, and the sealed pressurized portion 230. Once the test samples are ready for measurement and are stored in the sealed container 232, the controller 240 purges the air out of the sealed container 232 with gas stored in the gas storage tank 234. After the test rod is inserted into the vibrating mechanism 220 and the cryogenic tank 210, the controller 240 activates the vibrating mechanism 220. The controller 240 then instructs the electronic measurement devices 216 to perform the proper measurements and record the results.

Figure 3:
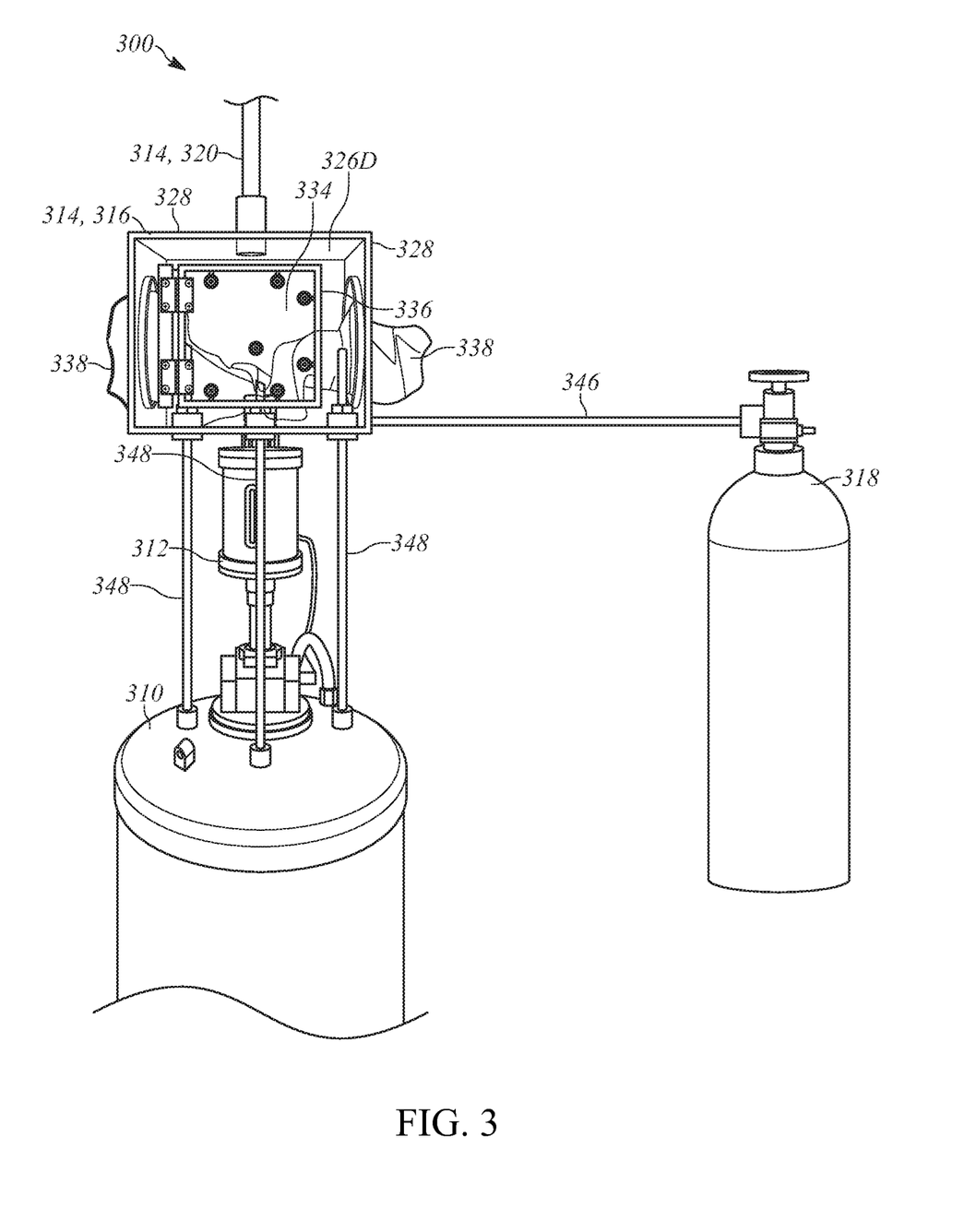
FIG. 3 is a side view of an example PPMS.

FIG. 3 is a side view of an example PPMS 300 that is similar to the PPMS 200 illustrated in FIG. 2. The PPMS 300 includes, a cryogenic tank (e.g., Dewar) 310, a holding device or a vibrating mechanism (e.g., vibrating sample magnetometer) 312, a sealed pressurized portion 314 and a controller (not shown) similar to the controller 240 illustrated in FIG. 2. The PPMS 300 is configured to measure superconductive physical properties of a test sample (e.g., silicon wafer) illustrated in FIG. 8.

The cryogenic tank 310 stores a cryogenic liquid (e.g., liquid helium) at extremely low temperatures (e.g., cryogenic temperature of approximately 4 K). The cryogenic tank 310 includes an opening defined in a top surface that fluidly communicates with a chamber for insertion of the test sample described below. The cryogenic tank 310 further includes electronic measurement devices (not shown) similar to the electronic devices 222 above to measure the superconductive physical properties of the test sample, such as magnetization, superconductivity, etc.

The holding device or vibrating mechanism 312 is connected to a top of the cryogenic tank 310. Both the holding device or the vibrating mechanism 312, when connected to the cryogenic tank 310 form a path that allows the insertion of the test sample through the holding device or the vibrating mechanism 312 and into the cryogenic tank 310. The holding device clamps and holds a test rod (see FIG. 7) in place while measurements are being performed on the test sample. The vibrating mechanism 312, if applicable, serves two functions. First, the vibrating mechanism 312 clamps and holds the test rod in place while measurements are being performed on the test sample. Second, during certain measurements, the vibrating mechanism 312 vibrates the test rod, which in turn vibrates the test sample while measurements are being performed on the test sample.

Figure 4:
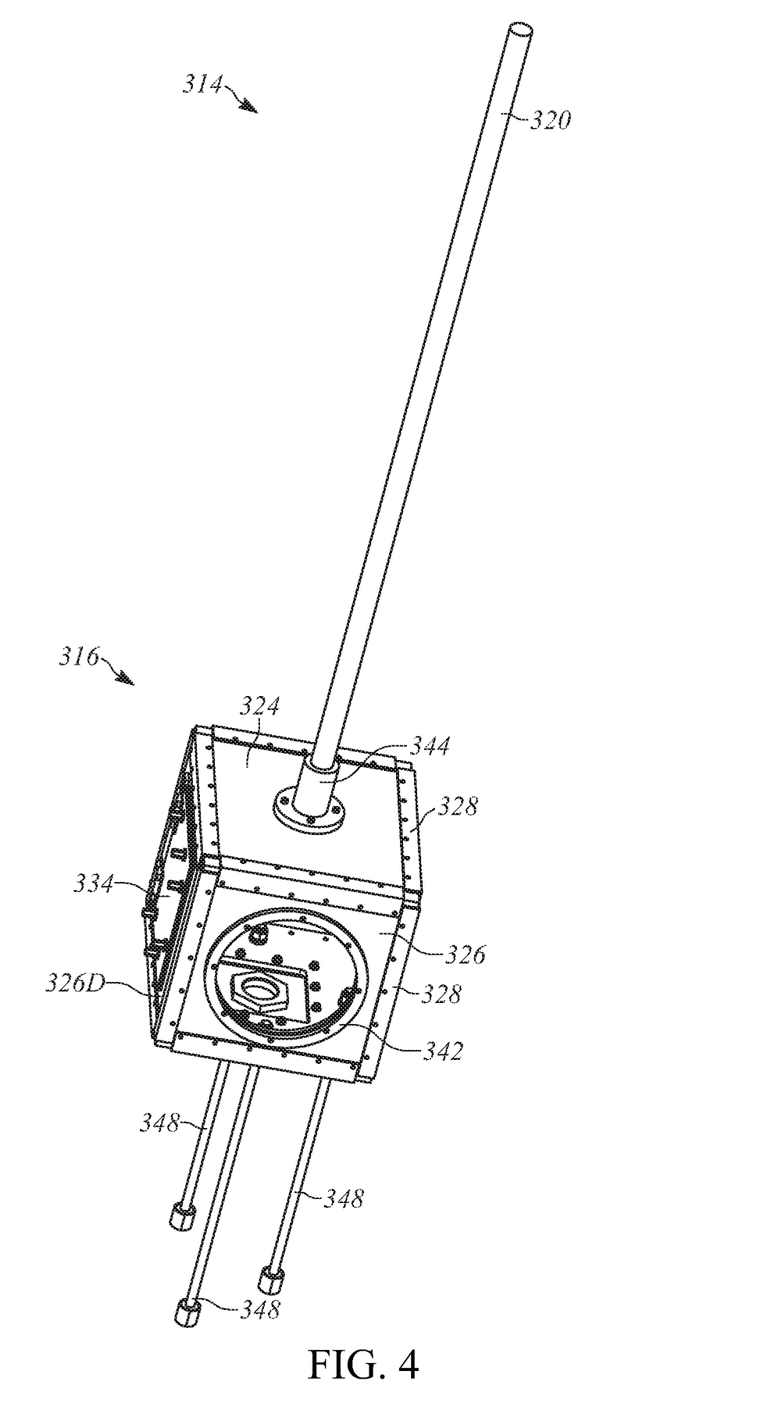
FIG. 4 is a perspective view of a sealed pressurized portion of a PPMS.
Figure 5:
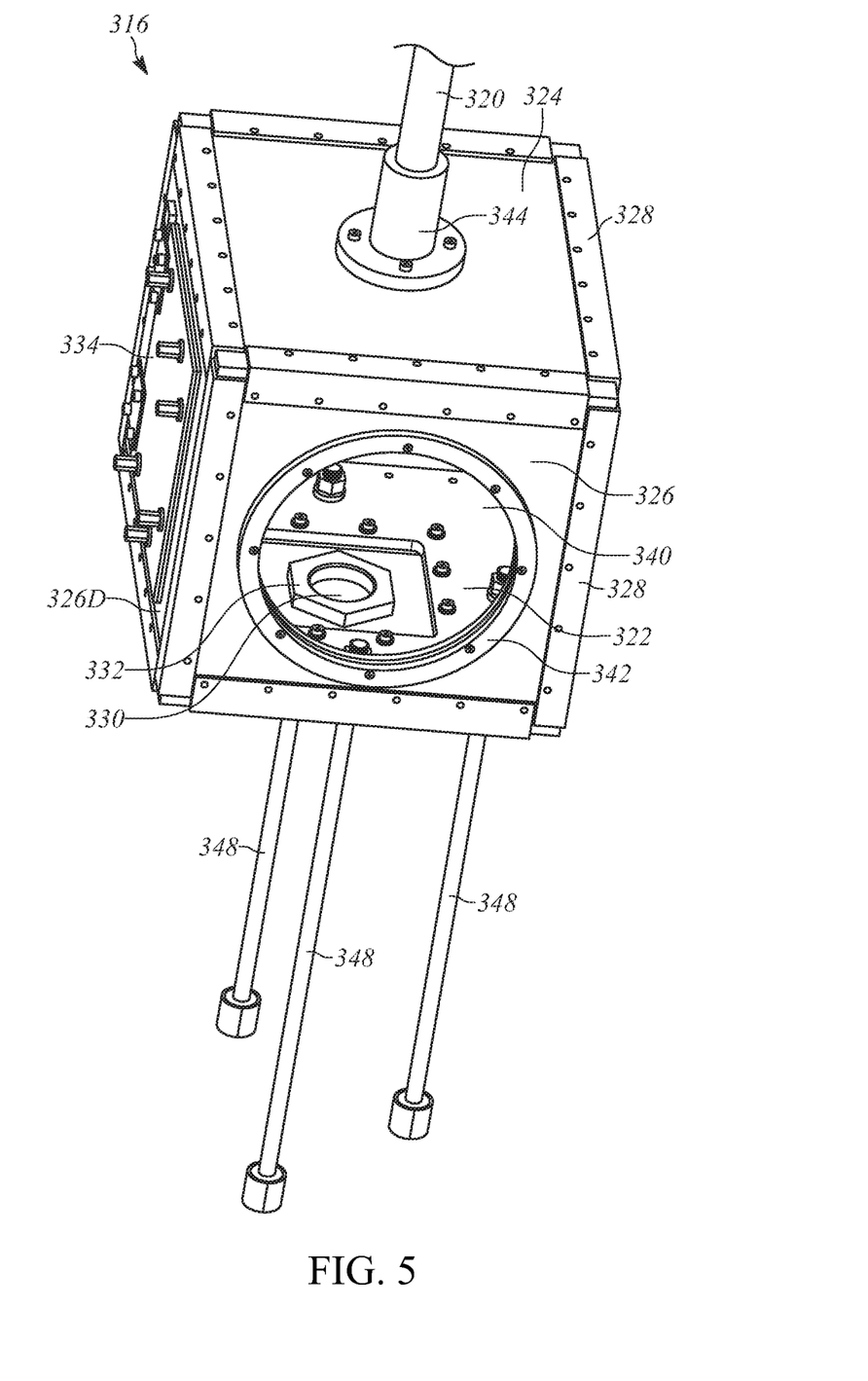
FIGS. 5 and 6 are perspective and side views respectively of a sealed container of the sealed pressurized portion of the PPMS.
Figure 6:
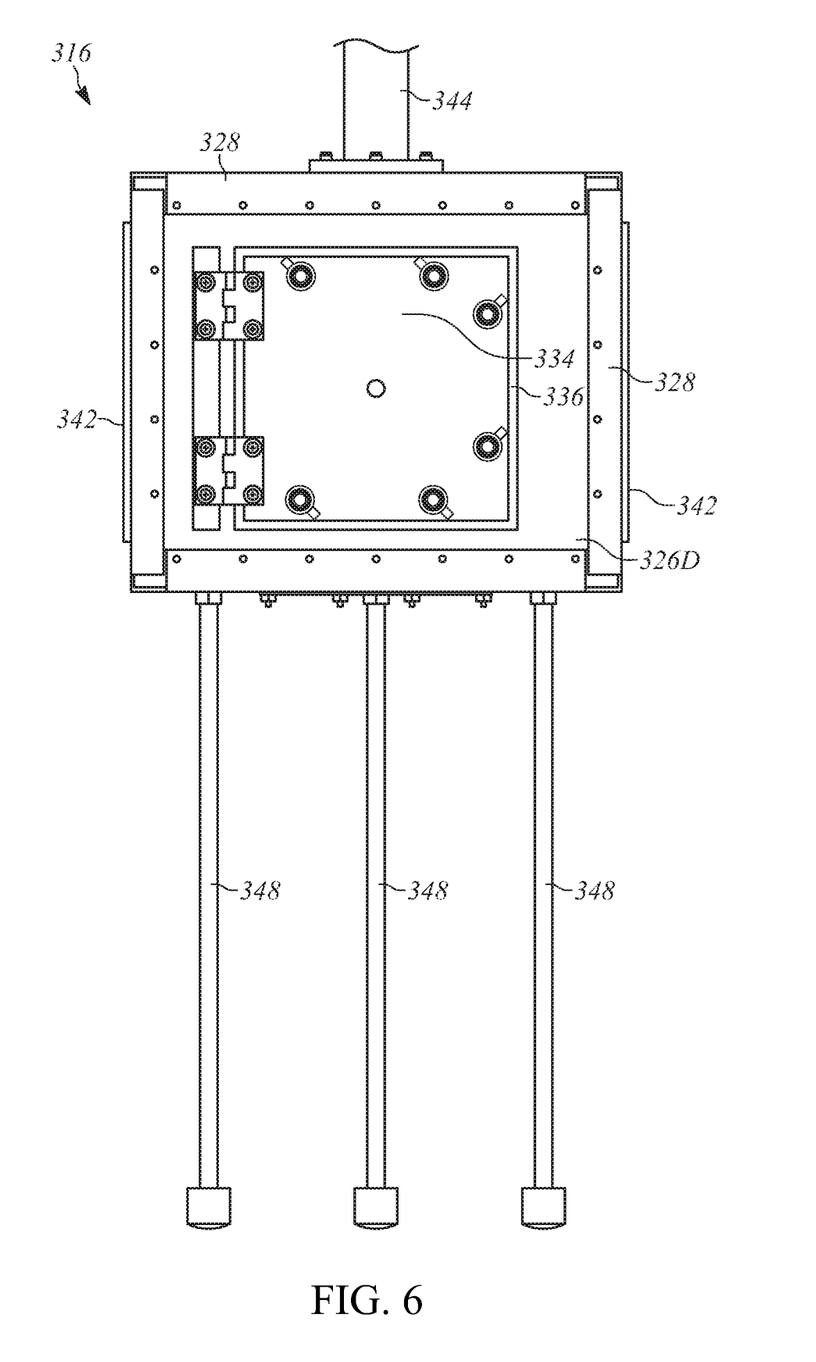

The sealed pressurized portion 314 is comprised of a sealed test sample container (hereinafter "sealed container") 316, a gas storage tank 318 similar to the gas storage tank 234 illustrated in FIG. 2, and a test rod retraction tube 320. Referring to FIG. 3 and also to FIGS. 4-6, the sealed container 316 has a rectangular, cube shape and includes a bottom surface 322, a top surface 324, and side walls 326 that connects the bottom surface 322 to the top surface 324. The bottom surface 322, top surfaces 324 and the side walls 326 are all made from an optically transparent material (e.g., polycarbonate, etc.). The bottom surface 322, the top surface 324, and the side walls 326 are joined and sealed together with metal or plastic angled joints 328 to thereby create an air tight environment inside the sealed container 316. A mounting opening 330 is defined in the bottom surface 322 that allows the sealed container 316 to be attached directly to the cryogenic tank 310 or the optional vibrating mechanism 312 via an attachment device (threaded polycarbonate nut) 332. The attachment device 332 forms an air tight seal between the cryogenic tank 310 or the optional vibrating mechanism 312 and the bottom surface 322 of the sealed container 316.

A hinged or removable test sample insertion door (hereinafter "door") 334 made from the same material as the side walls 326 is attached to one of the side walls, more specifically to a door side wall 326D. The door 334 allows test samples to be placed inside the sealed container 316 prior to measurement and removed from the sealed container 316 after measurement. The door 334 includes a seal 336 disposed around a perimeter of the door 334. Thus, when the door 334 is in a closed position, the seal 336 forms an airtight seal against the door side wall 326D.

The sealed container 316 further includes a pair manipulating gloves 338 that allow a user to switch out test samples from a test rod inside the sealed container 316. Specifically, glove openings 340 are defined in the two opposite side walls 326 that do not include the door 334 of the sealed container 316. One each of the pair of manipulating gloves 338 is attached to the two opposite side walls 326 that do not contain the door 334 (non-door side walls). More specifically, an insertion portion of each glove 338 is attached to the side wall 326 with a seal ring assembly 342. The seal ring assembly 342 includes a seal and a flange and forms an air tight seal around the glove openings 340 between the insertion portion of the gloves 338 and the side walls 326 of the sealed container 316. The gloves 338 extend inside the sealed container 316 to allow the user to manipulate the test samples on an interior of the sealed container 316 during the measurement procedure.

The test rod retraction tube 320 attaches to the top surface 324 of the sealed container 316. An opening is defined in the top surface 324 of the sealed container 316 and the test rod retraction tube 320 is attached and sealed to cover the opening in the top surface 324 via a sealed flange 344. Thus, the sealed flange 344 forms an air tight seal between the sealed flange 344 and the top surface 324 of the sealed container 316. As explained above, when the test rod is extracted from the cryogenic tank 310, the test rod extends into the test rod retraction tube 320 until the test sample is extracted from the cryogenic tank 310 and is in the interior of the sealed container 316. The test sample is then removed from the test rod and another test sample is attached to the end of the test rod. The test rod is then extracted from the test rod retraction tube 320 and inserted into the vibrating mechanism 312 (if applicable) and into the cryogenic tank 310 such that the test sample is inserted approximately 30-50% into the cryogenic tank 310. Thus, the test rod retraction tube 320 facilitates the extraction of the test rod and subsequently the extraction and changing of the test sample without water vapor deposition forming on the test samples.

The gas storage tank 318 is connected and sealed to, via a gas transfer hose 346, a port defined in a side wall 326 of the sealed container 316. The gas storage tank 318 stores a gas that is pumped into the sealed container 316 to pressurize the sealed container 316. Pressurization of the sealed container 316 (positive pressure of helium) purges the air out of the sealed container 316 and, thus reduces the humidity (i.e., amount of water vapor in the air) inside the sealed container 316. Once the humidity is below the threshold, the sealed pressurized portion 314 of the PPMS 300 is ready for measurement.

Optional support legs 348 can be attached to the bottom surface 322 of the sealed container 316. The support legs 348 extend away from the sealed container 316 toward the cryogenic tank 310 and rest on a top of the cryogenic tank 310 to provide additional support for the sealed container 316. The support legs 348 can include a threaded end and can be attached to the bottom surface 322 with fastening devices (e.g., threaded nuts) and can include a seal to form an air tight seal.

The controller provides control to the cryogenic tank 310, the vibrating mechanism 312 (if applicable), and the sealed pressurized portion 314. Once the test samples are ready for measurement and are stored in the sealed container 316, the controller purges the air out of the sealed container 316 with gas stored in the gas storage tank 318. After the test rod is inserted into the vibrating mechanism 312 and the cryogenic tank 310, the controller activates the vibrating mechanism 312. The controller then instructs the electronic measurement devices to perform the proper measurements and records the results.

Figure 7:
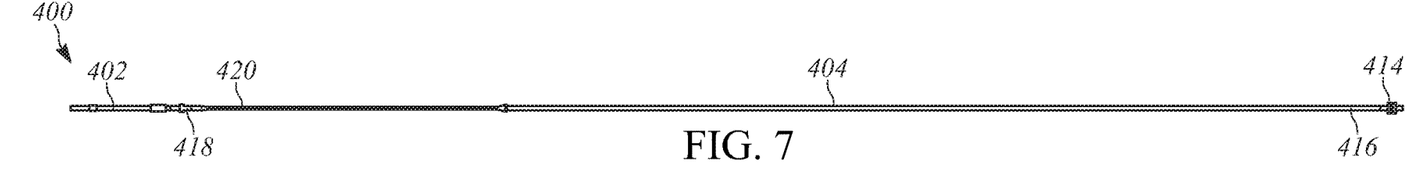
FIG. 7 is an illustration of an example rod assembly that includes a test sample rod and a test rod.
Figure 8:
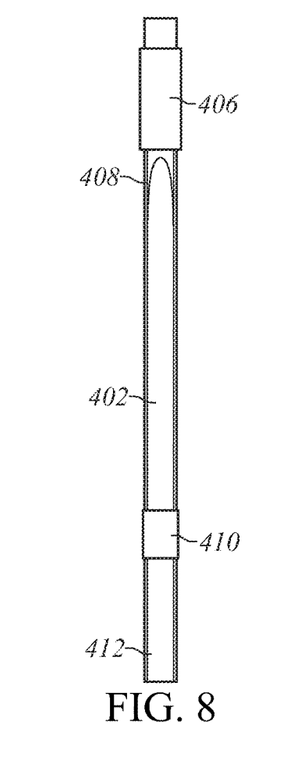
FIG. 8 is an illustration of the test sample rod of FIG. 7.

FIGS. 7 and 8 illustrate examples of a rod assembly 400 comprised of a test sample rod 402 and a test rod 404. The test sample rod 402 is made from quartz and is approximately one foot in length. The test sample rod 402 includes a connector (e.g., threaded connector) 406 at a first (proximate) end 408. A test sample 410 is attached to a second (distal) end 412 of the test sample rod 402 using an adhesive (e.g., kapton tape). The test rod 404 is made from carbon fiber and is approximately 3 feet in length. The test rod 404 includes a grip 414 at a proximate (first) end 416 that facilitates insertion into the cryogenic tank 310 and in securing the test rod 404 in the vibrating/holding mechanism 312. The test rod 404 further includes a connector (e.g., threaded connector) 418 at a distal (second) end 420 that mates with the connector 406 from the test sample rod 402.

Figure 9:
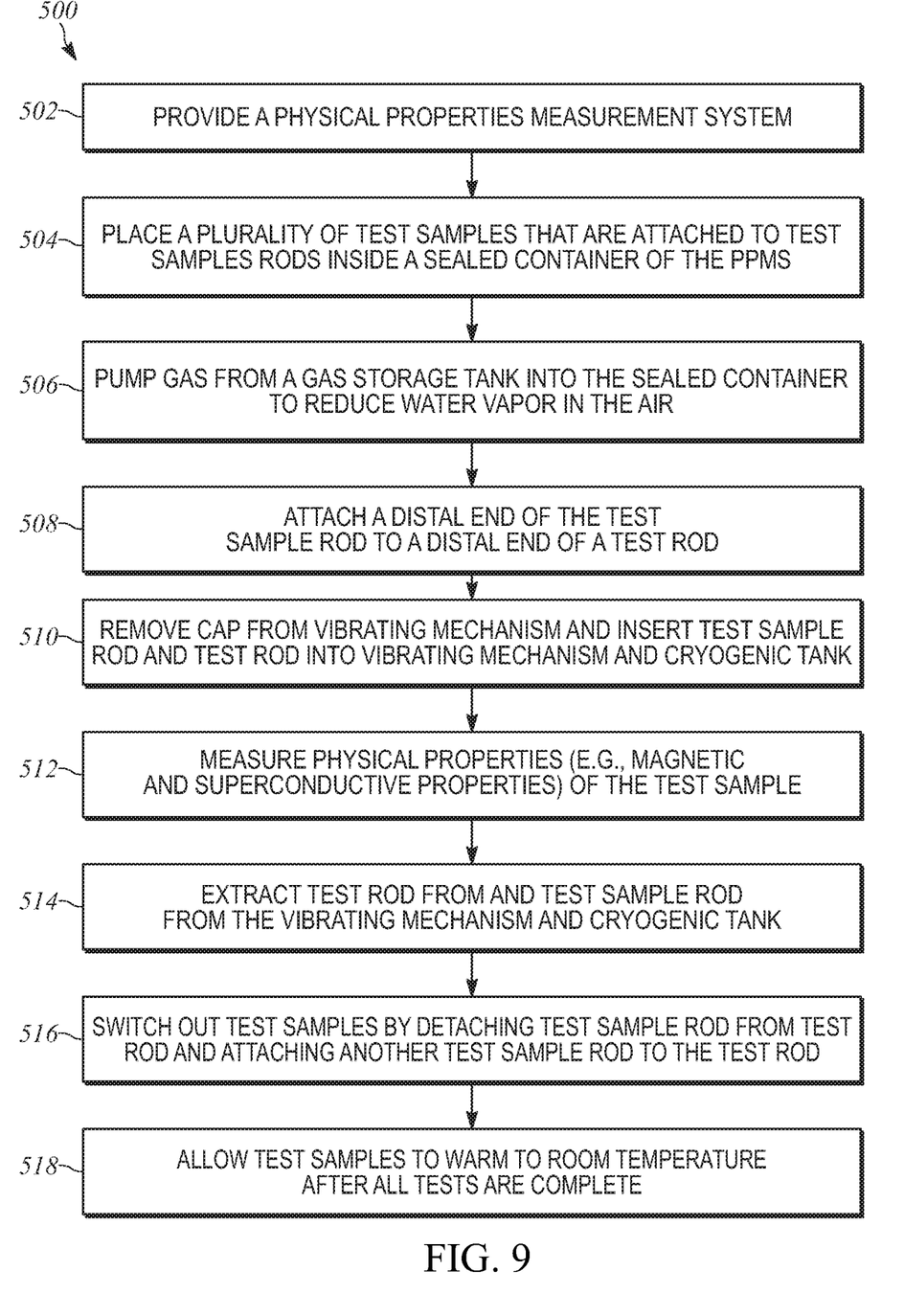
FIG. 9 is a block diagram illustrating a method of measuring physical properties of the test sample.

FIG. 9 illustrates a method 500 of performing measurements on a test sample (e.g., silicon wafer) to measure physical properties (e.g., measure magnetic and superconductivity properties) of the test sample. At 502, a closed physical properties measurement system (e.g., PPMS 300) including a cryogenic tank (e.g., cryogenic tank 310) and a vibrating mechanism (e.g., vibrating mechanism 312) is provided as disclosed herein. A temperature of a cryogenic liquid (e.g., liquid helium) is already at a cryogenic temperature of approximately 4 K. The PPMS also includes a sealed pressurized portion having a sealed test sample container (e.g., sealed container 316), a gas storage tank (e.g., gas storage tank 318), and a test rod retraction tube (e.g., test rod retraction tube 320). A test rod (e.g., test rod 404) is already disposed inside the test rod retraction tube. At 504, multiple test samples are adhered to a distal end of quartz test sample rods (e.g., test sample rod 402) and the test sample rods are placed inside the sealed container. Once the test samples are inside the sealed container, the door to the sealed container is closed and sealed against a side wall of the sealed container. At 506, a gas (e.g., helium) is pumped from the gas storage tank into the sealed container to purge the air and the water vapor out of the sealed container and the test rod extraction tube. Once the water vapor (humidity) is below a threshold value (e.g., 10-20% humidity), the sealed container is pressurized and ready for commencement of the measurements, at which time the gas is turned off. Next, at 508 and 510 the test sample is inserted into the cryogenic tank. Specifically, at 508, a proximate end of the test sample rod is attached to a distal end of the test rod. At 510, a cap is removed from a top of a vibrating mechanism (e.g., vibrating mechanism 312) and the test rod and the test sample rod are inserted down through the vibrating mechanism until the test sample is inside the sample test chamber inside the cryostat (the test sample is now approximately 30-50% down into the cryogenic tank). The test rod is secured in the vibrating mechanism and the cap is securely placed back on the vibrating mechanism. At 512, measurements of the physical properties (e.g., measurement of magnetic propertied, superconductive properties, etc.) are taken of the test sample, as disclosed herein. At 514, after the measurements are complete, the test rod is extracted from the vibrating mechanism and extended into the test rod retraction tube until the test sample rod and the test sample are extracted from the cryogenic tank. At 516, a user uses gloves (e.g., manipulating gloves 338) to switch out the test sample inside the sealed container by detaching the test sample rod from the test rod and attaching another test rod (and test sample) to the test rod, at which time the process is repeated. After all the measurements are completed, at 518, the test samples remain inside the sealed container until they reach room temperature, either naturally or by warming the test sample, to prevent water vapor deposition on the test samples when they are exposed to the outside air.

As disclosed herein, a sealed container having gloves attached thereto as part of a PPMS saves considerable time during a physical properties measurement process for a test sample. The measuring process does not require that the sample test chamber inside the cryostat where the actual physical properties measurements take place, be warmed to room temperature before removal of the test sample from the cryogenic tank in order to prevent water vapor deposition on the test sample. Rather, when the test sample is extracted from the cryogenic tank, the test sample and cryostat remain in a gaseous helium, relatively humidity free atmosphere inside the sealed container. The relatively humidity free atmosphere prevents water vapor deposition on the test sample and in the cryostat thereby preventing damage to the cryostat due to the formation of ice crystals on and inside the cryostat. Another test sample can be readily attached to the test rod and the test process can commence immediately thereby saving time for the cryogenic liquid to warm to room temperature and then cool back down to the cryogenic temperature for measurement.

For purposes of simplification of explanation the terms "overlay", "overlaying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A physical properties measuring system comprising:
   a cryogenic tank that contains a cryogenic liquid cooled to a cryogenic temperature, the cryogenic tank including a cryostat disposed therein and having an opening defined in a top surface;
   a sealed container attached to the cryogenic tank, the sealed container including a mounting opening defined in a bottom surface that aligns with the opening in the top surface of the cryogenic tank and a fastening device that attaches the sealed container to the cryogenic tank such that an air tight seal is formed between the sealed container and the cryogenic tank;
   a test rod retraction tube attached to a top surface of the sealed container, the test rod retraction tube having a seal flange that seals an opening defined in the top surface of the sealed container such that an air tight seal is formed between the sealed container and the test rod retraction tube;
   a door attached to a door side wall of the sealed container, the door including a seal that forms an air tight seal between the door and the door side wall when the door is in a closed position; and
   gloves that allow access the interior of the sealed container via glove openings defined in opposite side walls of the sealed container and seal ring assemblies that seal the gloves to the side walls of the sealed container such that an air tight seal is formed between the sealed container and the gloves.

2. The physical properties measuring system of claim 1, wherein the sealed container further includes support legs that extend from the bottom surface of the sealed container toward the cryogenic tank and contact the top of the cryogenic tank to support the sealed container.

3. The physical properties measuring system of claim 1 further comprising a gas storage tank that supplies gas to the sealed container via a gas transfer hose to an opening defined in a side wall of the sealed container, wherein the gas pressurizes the sealed container to purge air out from inside the sealed container and the test rod retraction tube to reduce water vapor inside the sealed container and the test rod retraction tube to below a water vapor threshold.

4. The physical properties measuring system of claim 1 further comprising a test rod holding device attached between the top of the cryogenic tank and the bottom surface of the sealed container, wherein the test rod holding device secures a test rod in place during measurement of physical properties of a plurality of test samples.

5. The physical properties measuring system of claim 4, wherein the test rod holding device is a vibrating mechanism that vibrates the test rod during measurement of the physical properties.

6. The physical properties measuring system of claim 1, wherein a plurality of test samples are placed inside the sealed container via the door in preparation of measuring physical properties of the plurality of test samples.

7. The physical properties measuring system of claim 6, wherein one of the plurality of test samples is immersed in the cryogenic liquid to measure the physical properties.

8. The physical properties measuring system of claim 7, wherein the one of the plurality of test samples is removed from the cryogenic tank and is exchanged for another one of the plurality of test samples inside the sealed container to prevent ice formation inside the cryostat.

9. The physical properties measuring system of claim 8, wherein the test rod retraction tube receives a test rod when the one of the plurality of test samples is removed from the cryogenic tank and is exchanged for another one of the plurality of test samples inside the sealed container.

10. The physical properties measuring system of claim 6, wherein the test samples are silicon wafers and the measured physical properties include magnetic and superconductive properties.

11. The physical properties measuring system of claim 1, wherein the cryogenic temperature is approximately 4 K.

12. The physical properties measuring system of claim 1, wherein the cryogenic liquid is liquid helium.

* * * * *